United States Patent
Singhal

(10) Patent No.: US 12,244,304 B2
(45) Date of Patent: Mar. 4, 2025

(54) SWITCH CIRCUIT

(71) Applicant: TEXAS INSTRUMENTS INCORPORATED, Dallas, TX (US)

(72) Inventor: Vipul K. Singhal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 18/193,905

(22) Filed: Mar. 31, 2023

(65) Prior Publication Data

US 2024/0333285 A1 Oct. 3, 2024

(51) Int. Cl.
*H03K 17/687* (2006.01)

(52) U.S. Cl.
CPC .................. *H03K 17/6872* (2013.01)

(58) Field of Classification Search
CPC .................................................. H03K 17/6872
See application file for complete search history.

(56) References Cited

U.S. PATENT DOCUMENTS

| | | | |
|---|---|---|---|
| 2009/0153539 A1* | 6/2009 | Le | G09G 3/3696 345/212 |
| 2009/0289692 A1* | 11/2009 | Chen | H03K 17/063 327/434 |

* cited by examiner

*Primary Examiner* — Metasebia T Retebo
(74) *Attorney, Agent, or Firm* — John R. Pessetto; Frank D. Cimino

(57) ABSTRACT

In examples, an apparatus has input and output terminals, and includes a first transistor having a first gate, source, and drain, wherein the first source is coupled to the input terminal, and the first drain is coupled to the output terminal, a second transistor having a second gate, source, and drain, wherein the second gate is coupled to a ground terminal, and the second source is coupled to the first gate, a third transistor having a third gate, source, and drain, wherein the third gate is coupled to an enable terminal, the third source is coupled to the ground terminal, and the third drain is coupled to the second drain, and a fourth transistor having a fourth gate, source, and drain, wherein the fourth gate is coupled to the second drain, the fourth source is coupled to the second source, and the fourth drain is coupled to the input terminal.

15 Claims, 6 Drawing Sheets

SWITCH CIRCUIT

BACKGROUND

Some systems include circuits that pass or block a signal. These circuits may be subject to various operational requirements, such that challenges may arise in meeting multiple of the operational requirements.

SUMMARY

In some examples, an apparatus has an input terminal and an output terminal. The apparatus includes a first transistor having a first gate, a first source, and a first drain, wherein the first source is coupled to the input terminal, and the first drain is coupled to the output terminal. The apparatus also includes a second transistor having a second gate, a second source, and a second drain, wherein the second gate is coupled to a ground terminal, and the second source is coupled to the first gate. The apparatus also includes a third transistor having a third gate, a third source, and a third drain, wherein the third gate is coupled to an enable signal terminal, the third source is coupled to the ground terminal, and the third drain is coupled to the second drain. The apparatus also includes a fourth transistor having a fourth gate, a fourth source, and a fourth drain, wherein the fourth gate is coupled to the second drain, the fourth source is coupled to the second source, and the fourth drain is coupled to the input terminal.

In some examples, an apparatus has an input terminal and an output terminal. The apparatus includes a first transistor having a first gate, a first source, and a first drain, wherein the first gate is coupled to the input terminal, and the first drain is coupled to the output terminal. The apparatus also includes a second transistor having a second gate, a second source, and a second drain, wherein the second gate is coupled to the input terminal, the second source is coupled to a ground terminal, and the second drain is coupled to the output terminal. The apparatus also includes a third transistor having a third gate, a third source, and a third drain, wherein the third gate is coupled to the output terminal, the third source is coupled to the first source, and the third drain is coupled to a voltage supply terminal.

In some examples, a system includes a signal circuit configured to provide a first analog signal having a first voltage. The system also includes a processing circuit. The system also includes a switching circuit coupled to the signal circuit and the processing circuit, wherein the switching circuit is configured to provide a second analog signal to the processing circuit based on the first analog signal, and the first voltage is greater in value than a supply voltage of the switching circuit. The switching circuit includes a first transistor having a first gate, a first source, and a first drain, wherein the first source is coupled to the signal circuit, and the first drain is coupled to the processing circuit. The switching circuit also includes a second transistor having a second gate, a second source, and a second drain, wherein the second gate is coupled to a ground terminal, and the second source is coupled to the first gate. The switching circuit also includes a third transistor having a third gate, a third source, and a third drain, wherein the third gate is coupled to an enable signal terminal, the third source is coupled to the ground terminal, and the third drain is coupled to the second drain. The switching circuit also includes a fourth transistor having a fourth gate, a fourth source, and a fourth drain, wherein the fourth gate is coupled to the second drain, the fourth source is coupled to the second source, and the fourth drain is coupled to the signal circuit.

DETAILED DESCRIPTION

As described above, some systems include circuits that pass or block a signal. In an example, such a circuit is referred to as a switch circuit. These circuits may be subject to various operational requirements, such that challenges may arise in meeting multiple of the operational requirements. For example, a switch circuit may receive a high voltage, precious charge (HVPC) signal. A HVPC signal may be a signal having a voltage greater in value than a supply voltage available to the switch circuit and a current that is insufficient to be used as a power source. An example of a component that may provide an HVPC signal is a charge pump. In some examples, the charge pump may be designed at a minimum capacity for an application environment in which the charge pump is implemented, such as to mitigate electromagnetic interference (EMI) generation by the charge pump, reduce an area consumed by the charge pump, reduce power consumed by the charge pump, or other various considerations in comparison to charge pumps deigned for larger capacities. As such, a signal provided by the charge pump may not have sufficient current to function as a power source.

Examples of this description provide for a boot-strap architecture to charge switching elements, facilitating the passing or blocking of an HVPC signal. In some examples, the boot-strap architecture provides a high-gain, positive-feedback loop for controlling passing or blocking of the HVPC signal.

Figure 1:
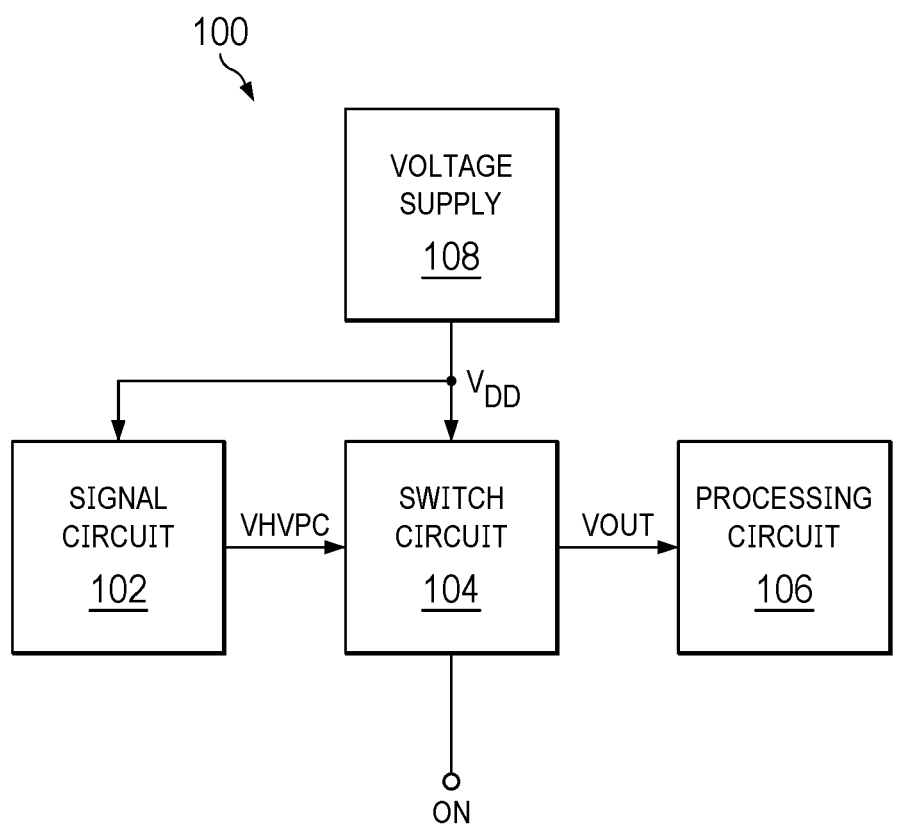
FIG. 1 is a block diagram of an example system.

FIG. 1 is a block diagram of an example system 100. In various examples, the system 100 is representative of an application in which an input signal is HVPC signal, as described herein, resulting from a weak charge pump. In some application environments, a weak charge pump, resulting in a HVPC signal, may have certain benefits compared to a strong charge pump (providing a non-HVPC signal). These application environments may include low-power implementations (such as Internet-of-Things nodes), implementations sensitive to EMI (such as automotive radios), implementations sensitive to size, or a combination thereof. In an example, the system 100 includes a signal circuit 102, a switch circuit 104, and a processing circuit 106. The system 100 may also include, or be coupled to, a voltage supply 108. The signal circuit 102 is coupled to an input of the switch circuit 104, which has an output coupled to the processing circuit 106. The voltage supply 108 is coupled to an input of the signal circuit 102 and to a second input of the switch circuit 104. The switch circuit 104 also has a third input to receive an enable signal (ON). The enable signal may be received from any suitable source, such as a controller (not shown), processor (not shown), or other circuit, device, or component.

In an example of operation of the system 100, the signal circuit 102 provides a signal (VHVPC) to the switch circuit 104. The signal may be a HVPC signal, as described above herein. The signal circuit 102 may generate, determine, or provide the signal according to any suitable process and via any suitable component or components, the scope of which is not limited herein. In some examples, the signal circuit 102 is, or includes, a charge pump for providing VHVPC. The voltage supply 108 provides a supply voltage (VDD) to the signal circuit 102 and/or the switch circuit 104. In an example, VHVPC has a voltage greater in value than VDD. Based on a state of ON, the switch circuit 104 provides VHVPC to the processing circuit 106 as VOUT, or blocks VHVPC from being provided to the processing circuit 106 as VOUT. For example, responsive to ON having an asserted value, such as a value of logic 1 in a same voltage domain as VDD, the switch circuit 104 provides VHVPC to the processing circuit 106 as VOUT. Responsive to ON having a deasserted value, such as a value of logic 0 or approximately a ground voltage potential in a same voltage domain as VDD, the switch circuit 104 blocks VHVPC from being provided to the processing circuit 106 as VOUT.

Figure 2:
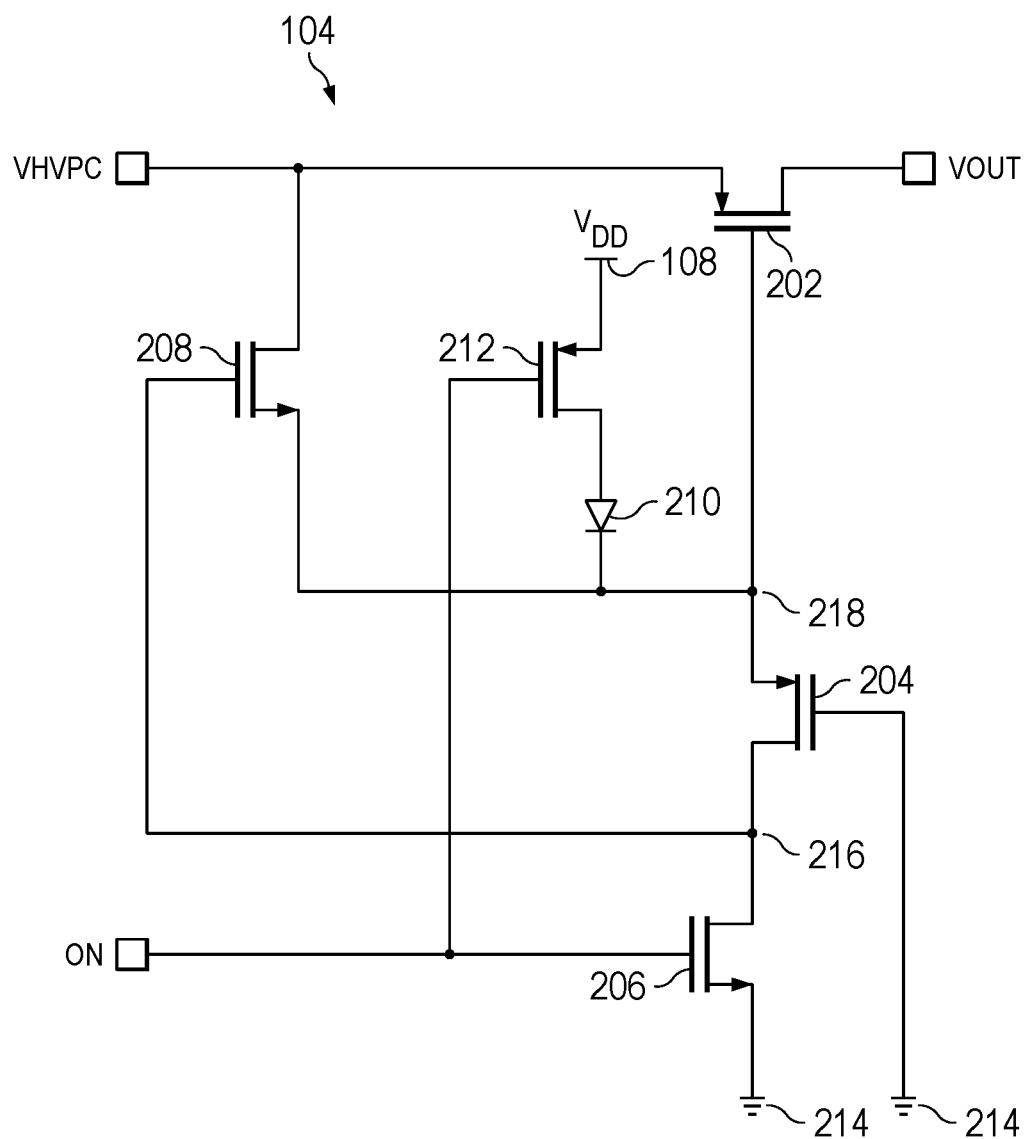
FIG. 2 is a schematic diagram of an example switch circuit.

FIG. 2 is a schematic diagram of an example switch circuit 104. In an example, the switch circuit 104 includes a transistor 202, a transistor 204, a transistor 206, a transistor 208, a diode 210, and a transistor 212. In an example architecture of the switch circuit 104, the transistor 202 has a source, a gate, and a drain. In an example, the transistor 202 receives VHVPC at its source and provides VOUT at its drain. In examples of the switch circuit 104 that are implemented in the system 100, the transistor 202 is coupled at its source to the signal circuit 102 and at its output to the processing circuit 106. The transistor 204 has a source coupled to the gate of the transistor 202, a gate coupled to a ground terminal 214 at which a ground voltage potential is provided, and has a drain. The transistor 206 has a drain coupled to the drain of the transistor 204, a source coupled to the ground terminal 214, and a gate at which ON may be received. The transistor 208 has a drain coupled to the source of the transistor 202, a source coupled to the source of the transistor 204, and a gate coupled to the drain of the transistor 204. The diode 210 has an anode, and has a cathode coupled to the source of the transistor 204. The transistor 212 has a source at which VDD may be received, a drain coupled to the anode of the diode 210, and a gate coupled to the gate of the transistor 206. In examples of the switch circuit 104 that are implemented in the system 100, the transistor 212 is coupled at its source to the voltage supply 108.

In some examples, the transistor 204 is an enhancement mode p-channel metal oxide semiconductor (PMOS), and the transistor 208 is a depletion mode n-channel metal oxide semiconductor (NMOS). In some examples, the transistor 208 is a native NMOS. In some examples, the transistor 206 is an enhancement mode n-channel metal oxide semiconductor (NMOS), and the transistors 202 and 212 are each enhancement mode PMOS. Generally, the transistor 204 and the transistor 208 are selected such that an absolute value of a gate-to-source voltage (Vgs) threshold of the transistor 208 (|VT208|) is less than an absolute value of a Vgs threshold of the transistor 204 (|VT204|).

In an example of operation of the switch circuit 104, the transistor 202 is controlled to either pass VHVPC as VOUT or block VHVPC from being provided as VOUT. For example, responsive to ON having an asserted value, the transistor 202 is controlled to be conductive and functions as a short, providing VHVPC as VOUT, minus any voltage loss associated with the transistor 202. Responsive to ON not having an asserted value, the transistor 202 is controlled to not be conductive, blocking VHVPC from being provided as VOUT. For the sake of understanding, operation of the switch circuit 104 will be described in four operational states-ON having a steady-state asserted value, ON transitioning from an asserted value to a deasserted value, ON having a steady-state deasserted value, and ON transitioning from a deasserted value to an asserted value.

Responsive to ON having a steady-state asserted value, the transistor 206 is conductive, or turned on, and pulls down the node 216 to a ground voltage potential. The asserted value of ON also causes the transistor 212 to be nonconductive, or turned off. Responsive to the transistor 206 pulling down the node 216 to the ground voltage potential, the transistor 204 becomes arranged in a diode-connected arrangement. The diode-connected arrangement clamps the node 218 to a voltage approximately equal to |VT204|. Because the node 216 is at a voltage approximately equal to the ground voltage potential, the transistor 208 becomes reverse biased based on the voltage provided at the node 218. Because the voltage provided at the node 218 is greater in value than |VT208|, the transistor 208 is turned off, or nonconductive. Therefore, no DC path exists between VHVPC and the ground terminal 214. In an example, |VT204| is approximately equal to 0.6 V and |VT208| is approximately equal to 0.1 V. In this way, the transistor 204 and the transistor 208 operate in mutually exclusive Vgs ranges such that the transistor 204 and the transistor 208 do not both operate in a forward conductive state at a same time. Also responsive to the transistor 206 pulling down the node 216 to the ground voltage potential, the transistor 208 is controlled to be nonconductive. In an example, responsive to ON having an asserted value, the voltage provided at the node 218 has a value sufficiently less than VHVPC to cause the transistor 202 to turn on, providing VHVPC as VOUT, minus any voltage loss associated with the transistor 202. For example, the transistor 202 is a PMOS device that becomes conductive in response to Vgs of the transistor 202 being less than a threshold value of the transistor 202. Thus, providing a voltage approximately equal to |VT204| at the node 218, as described above, in the presence of VHVPC causes Vgs of the transistor 202 to be less than the threshold value of the transistor 202 and the transistor 202 to become conductive.

Responsive to receipt of a falling edge in ON (e.g., a transition from ON having an asserted value to ON having a deasserted value), the transistor 206 becomes non-conductive. The deasserted value of ON also causes the transistor 212 to be conductive. Responsive to the transistor 206 being conductive and VDD having a value greater than a voltage provided at the node 218 (V218), current flows from the voltage supply 108 through the transistor 212 and diode 210 to the node 218 to precharge the node 218. In an example, precharging the node 218 reduces an amount of current that may be drawn from VHVPC, such as by the transistor 208. The node 218 may be precharged to a value approximately equal to VDD minus a voltage drop of the diode 210 and any voltage drop associated with the transistor 212. Responsive to V218 increasing to exceed |VT204|, the transistor 204 becomes conductive. Responsive to the transistor 204 becoming conductive, a voltage provided at the node 216 (V216) is pulled up to approximately equal to V218 minus any voltage drop associated with the transistor 204. The transistor 208 is in a source-follower arrangement causing V218 to follow V216. The rising value of V218 increases Vgs of the transistor 204, causing the transistor 204 to become more conductive and increasing a value of V216. Therefore, a boot-strap architecture, or high-gain, positive-feedback loop is formed by the transistor 204 and the transistor 208. Responsive to V218 increasing in value to exceed VDD, the diode 210 becomes reverse biased and current ceases to flow from the voltage supply 108 to the node 218.

Responsive to ON having a steady-state deasserted value, resistance of the transistor 204 becomes approximately zero (e.g., resulting from the rise in value of V218) such that the transistor 204 may be approximated as a short coupling the nodes 216, 218. As a result, Vgs of the transistor 208 is approximately zero. Because the transistor 208 is a depletion mode device, the Vgs of approximately zero causes the transistor 208 to remain on, pulling a value of V218 and V216 up to approximately equal the value of VHVPC. V218 having a value approximately equal to that of VHVPC causes the transistor 202 to turn off, blocking VHVPC from being provided to the processing circuit 106 as VOUT. In some examples, there is minimal to no steady-state leakage of current in the switch circuit 104 resulting from no path to ground for VHVPC, such as through the transistor 206.

Responsive to receipt of a rising edge in ON (e.g., a transition from ON having deasserted value to ON having an asserted value), the transistor 206 becomes conductive. The asserted value of ON also causes the transistor 212 to be non-conductive. V216 is pulled down to approximately equal the ground voltage potential, turning off the transistor 208 and causing the transistor 204 to again be in a diode-connected arrangement, as described above. In response, V218 decreases in value to be clamped to a voltage approximately equal to |VT204| and the transistor 202 is controlled again to become conductive.

Figure 3:
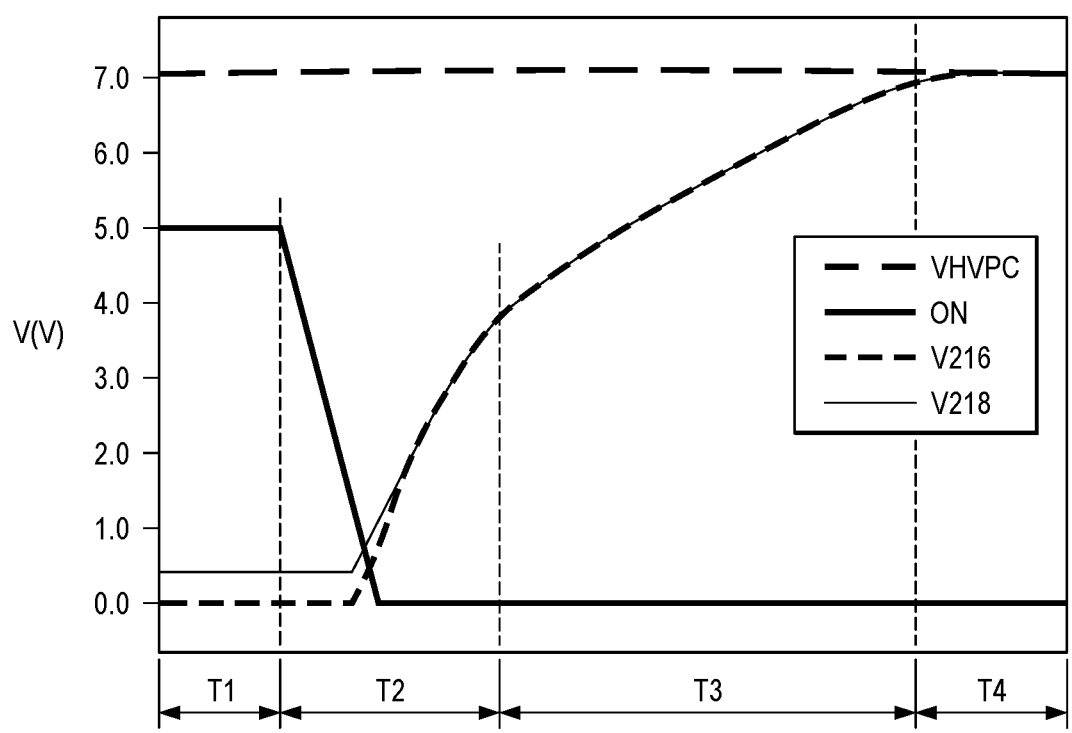
FIG. 3 is a timing diagram of example signals in a system.

FIG. 3 is a timing diagram 300 of example signals in a system, such as the system 100. For example, the signals of the timing diagram 300 are representative of signals provided in some examples of the switch circuit 104. The timing diagram 300 includes VHVPC, ON, V216, and V218, each as described above herein. The signals of the timing diagram 300 are shown having a vertical axis representative of voltage in units of volts (V) and a horizontal axis representative of time. The timing diagram 300 may be generally representative of signals provided in some examples of the switch circuit 104 during a transition of ON from an asserted value to a deasserted value, and is divided into four time ranges, T1, T2, T3, and T4.

During T1, ON is asserted and the switch circuit 104 operates as described above to be responsive to ON having a steady-state asserted value.

At a beginning of T2, ON begins decreasing in value to become deasserted. Responsive to ON decreasing below a Vgs threshold of the transistor 206, the transistor 206 becomes non-conductive and the transistor 212 becomes conductive. Responsive to the transistor 212 becoming conductive V218 begins to increase in value, and correspondingly V216 increases in value.

At a beginning of T3, a value of V218 exceeds (|VT204|), causing the transistor 204 to become conductive. The transistor 204 pulls up V216 to approximately equal V218, which increases based on the source follower arrangement of the transistor 208, as described above.

During T4, V218 and V216 approximately equal a value of VHVPC and the switch circuit 104 operates as described above to be responsive to ON having a steady-state deasserted value.

Figure 4:
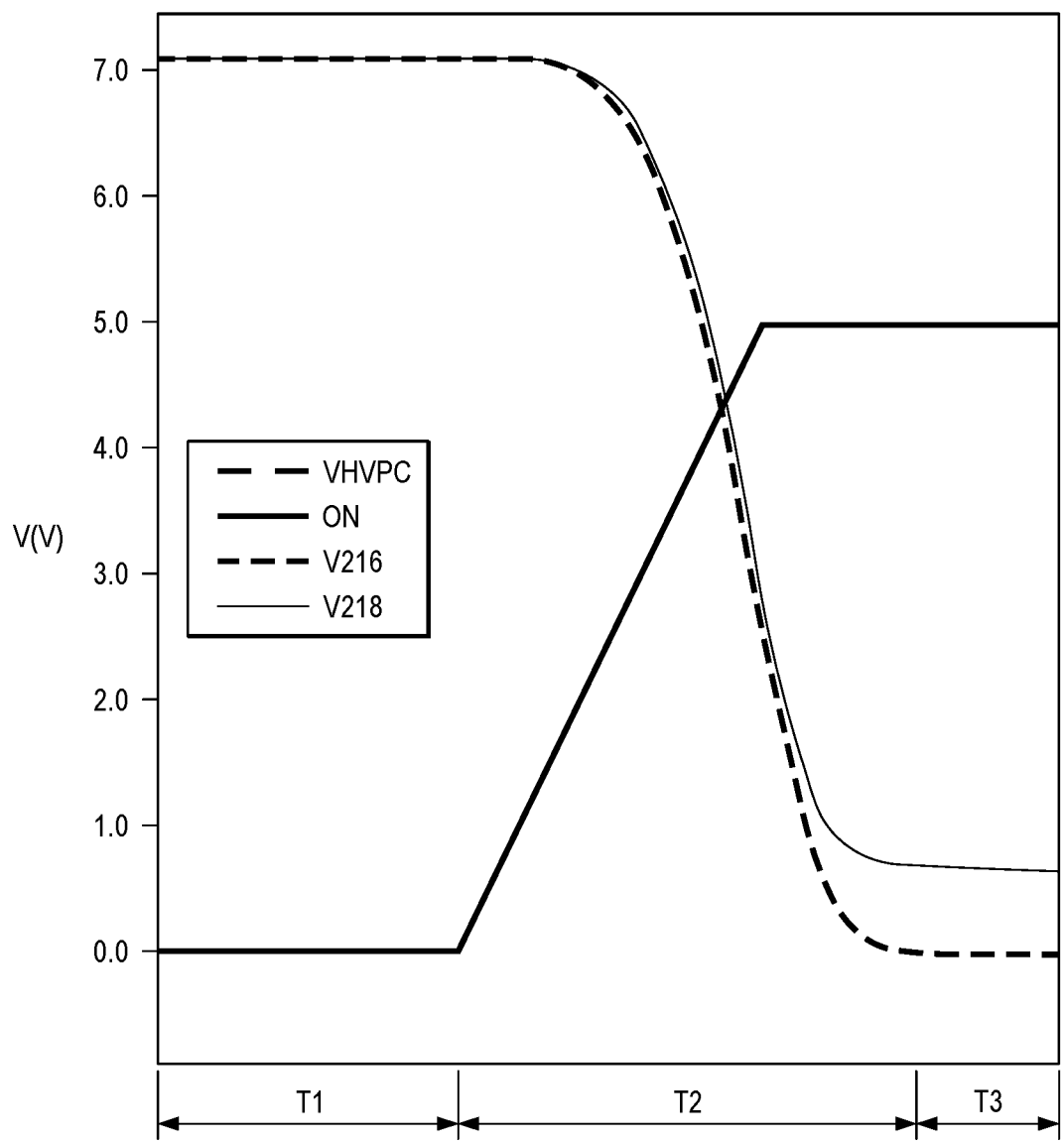
FIG. 4 is a timing diagram of example signals in a system.

FIG. 4 is a timing diagram 400 of example signals in a system, such as the system 100. For example, the signals of the timing diagram 400 are representative of signals provided in some examples of the switch circuit 104. The timing diagram 400 includes VHVPC, ON, V216, and V218, each as described above herein. The signals of the timing diagram 400 are shown having a vertical axis representative of voltage in units of V and a horizontal axis representative of time. The timing diagram 400 may be generally representative of signals provided in some examples of the switch circuit 104 during a transition of ON from a deasserted value to an asserted value, and is divided into time ranges, T1, T2, and T3.

During T1, ON is deasserted and the switch circuit 104 operates as described above to be responsive to ON having a steady-state deasserted value.

At a beginning of T2, ON begins to increase in value to become asserted. Responsive to ON increasing to exceed a Vgs threshold of the transistor 206, the transistor 206 becomes conductive and the transistor 212 becomes non-conductive. Responsive to the transistor 206 becoming conductive, the node 216 is coupled to the ground terminal 214, and V216 begins to discharge, decreasing in value to approximately the ground voltage potential. Similarly, the node 218 discharges proportionally to the node 216 such that V218 decreases in value until the node 218 is clamped to have a voltage no greater than a voltage drop associated with the body diode of transistor 204.

During T3, ON is asserted and the switch circuit 104 operates as described above to be responsive to ON having a steady-state asserted value.

Figure 5:
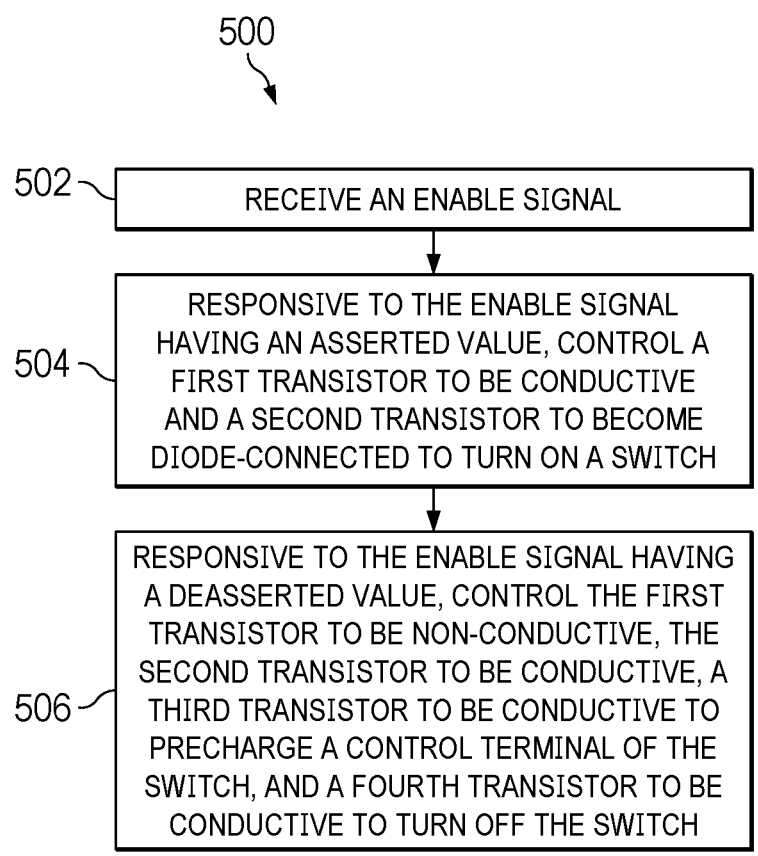
FIG. 5 is a flow diagram of an example method.

FIG. 5 is a flow diagram of an example method 500. In some examples, the method 500 is implemented to control a switch, such as the transistor 202. In an example, the method 500 is implemented by components of the switch circuit 104, such as the transistors 204, 206, 208, 212 and the diode 210.

At operation 502, an enable signal (such as ON, as described herein) is received.

At operation 504, responsive to the enable signal having an asserted value, a first transistor (e.g., 206) is controlled to be conductive and a second transistor (e.g., 204) is controlled to become diode-connected to turn on a switch (e.g., 202). In some examples, the first transistor becoming conductive and the second switch becoming diode-connected creates a pull-down path to ground from the switch, which may be implemented as a p-channel field-effect transistor (FET). In an example, the switch being turned on permits a signal to flow through the switch (e.g., makes the switch conductive). Conversely, the switch being turned off inhibits or prevents a signal (e.g., VHVPC) from flowing through the switch (e.g., makes the switch non-conductive).

At operation 506, responsive to the enable signal having a deasserted value, the first transistor is controlled to be non-conductive, the second transistor is controlled to be conductive, a third transistor (e.g., 212) is controlled to be conductive to precharge a control terminal (such as a gate) of the switch through a diode (e.g., 210), and a fourth transistor (e.g., 208) is controlled to be conductive to turn off the switch. In some examples, the third transistor provides a path for a voltage supply to precharge the control terminal of the switch, increasing a voltage provided at the control terminal of the switch. The fourth transistor becoming conductive may provide a path for charging the control terminal of the switch to a voltage sufficient for turning off the switch. In some examples, the third transistor becoming conductive prior to the fourth transistor becoming conductive reduces an amount of current drawn by the fourth switch to charge the control terminal of the switch to the voltage sufficient for turning off the switch. In an example, the fourth transistor is in a source-follower arrangement such that the second transistor and the fourth transistor form a high-gain, positive feedback loop, as described above herein.

Figure 6:
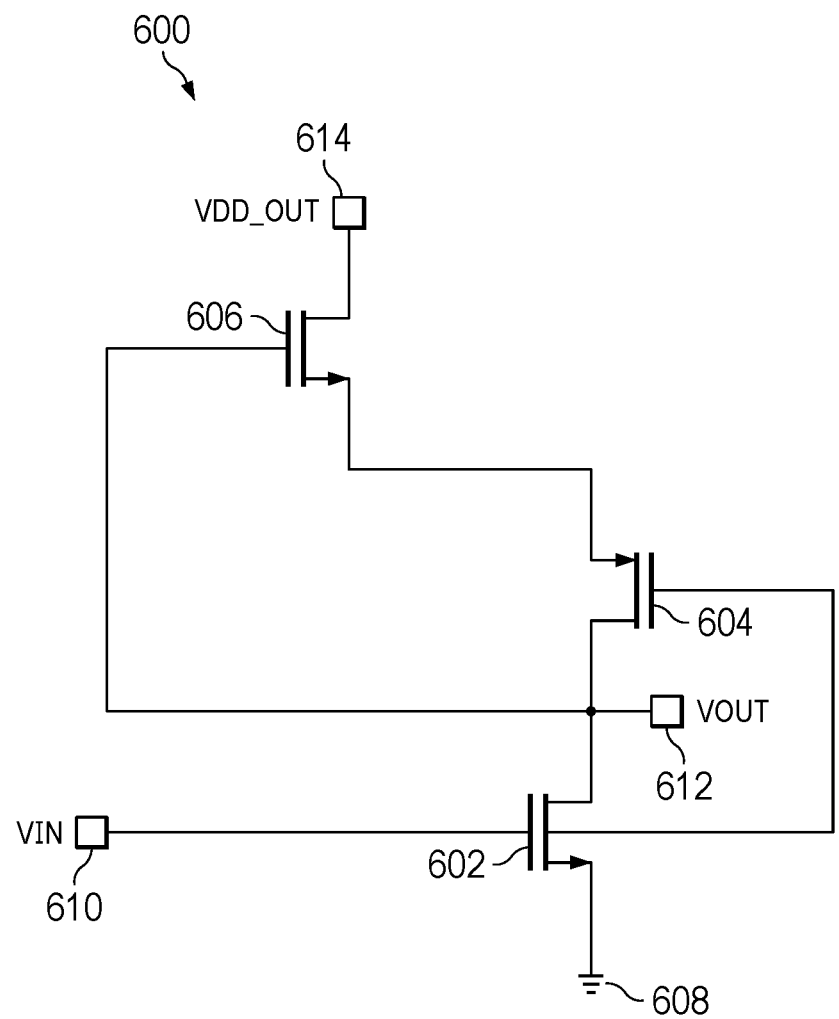
FIG. 6 is a schematic diagram of an example level shifter.

FIG. 6 is a schematic diagram of an example level shifter 600. In an example, the level shifter 600 includes a transistor 602, a transistor 604, and a transistor 606. In an example architecture of the level shifter 600, the level shifter 600 has a gate coupled to a node 610 at which an input voltage (VIN) is provided, a source coupled to a ground terminal 608 at which a ground voltage potential is provided, and a drain coupled to a node 612 at which an output voltage (VOUT) is provided. The transistor 604 has a gate coupled to the node 610, a drain coupled to the node 612, and a source. The transistor 606 has a gate coupled to the node 612, a source coupled to the source of the transistor 604, and a drain coupled to a supply node 614 at which a voltage supply (VDD_OUT) is provided. In some examples, the transistor 604 is an enhancement mode PMOS and the transistor 606 is a depletion mode NMOS. In some examples, the transistor 606 is a native NMOS.

In an example of operation of the level shifter 600, the level shifter 600 may facilitate voltage compatibility between components that may otherwise operate in voltage domains or voltage ranges that are incompatible with one another. In some cases, the voltage domains are low voltage and high voltage domains, respectively. For example, the low voltage domain may have an upper limit of less than or equal to about 1.1 V, and the high voltage domain may have a lower limit greater than or equal to about 1.8 V. In various other cases, other suitable voltage ranges are possible for the low voltage domain and/or the high voltage domain. For example, the level shifter 600 may receive VIN having a value defined according to a first voltage domain and provide VOUT having a voltage defined according to a second voltage domain. In some examples, VOUT is provided having a value of VDD_OUT or of the ground voltage potential, where VDD_OUT has a value that is greater than, or less than, VIN. In some examples, VOUT may have an inverse logical state from VIN. For example, if VIN has an asserted value VOUT has a deasserted value, and if VIN has a deasserted value VOUT has an asserted value. For the sake of understanding, operation of the level shifter 600 will be described in four operational states-VIN having a steady-state asserted value, VIN transitioning from an asserted value to a deasserted value, VIN having a steady-state deasserted value, and VIN transitioning from a deasserted value to an asserted value.

Responsive to VIN having an asserted value, the transistor 602 is conductive, or turned on, and pulls down the node 612 to approximately equal a ground voltage potential such that VOUT is provided having the ground voltage potential. The asserted value of VIN also causes the transistor 604 to be nonconductive, or turned off. The ground voltage potential provided at the node 612 via the conductivity of the transistor 602 causes the transistor 606 to be nonconductive. For example, responsive to VIN having an asserted value, the transistor 604 clamps a voltage at its source to approximately a value of VDD plus an absolute value of a Vgs threshold of the transistor 604 (|VT604|). Because the node 612 is at a voltage approximately equal to the ground voltage potential, the transistor 606 becomes reverse biased based on the voltage provided at the source of the transistor 604. Because the voltage provided at the source of the transistor 604 is greater in value than an absolute value of a Vgs threshold of the transistor 606 (|VT606|), the transistor 606 is turned off, or nonconductive. Therefore, no DC path exists between the supply node 614 and the ground terminal 608. In an example, |VT604| is approximately equal to 0.6 V and |VT606| is approximately equal to 0.1 V.

Responsive to VIN having a deasserted value, the transistor 602 becomes non-conductive. The deasserted value of VIN also causes the transistor 604 to be conductive. In some examples, responsive to VIN having a deasserted value the transistor 604 and the transistor 606 operate substantially similar to the transistor 204 and the transistor 208 of FIG. 2, respectively responsive to ON having a deasserted value, as described above. Accordingly, description of this operation is not repeated herein. In some examples, the level shifter 600 provides for an architecture having smaller size and less associated cost than other level shifters, such as by not including a connection to a voltage supply in the voltage domain of VIN.

In this description, the term "couple" may cover connections, communications, or signal paths that enable a functional relationship consistent with this description. For example, if device A provides a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors or capacitors, unless otherwise stated, include first and second terminals and are generally representative of any one or more elements coupled in series and/or parallel to provide an amount of impedance represented by the shown resistor or an amount of capacitance represented by the shown capacitor. For example, a resistor or capacitor shown and described herein as a single component may instead be multiple resistors or capacitors, respectively, coupled in parallel, series, or a combination thereof between the same two nodes as the single shown resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus having an input terminal and an output terminal, comprising:
a first transistor having a first gate, a first source, and a first drain, wherein the first source is coupled to the input terminal, and the first drain is coupled to the output terminal;
a second transistor having a second gate, a second source, and a second drain, wherein the second gate is coupled to a ground terminal, and the second source is coupled to the first gate;
a third transistor having a third gate, a third source, and a third drain, wherein the third gate is coupled to an enable signal terminal, the third source is coupled to the ground terminal, and the third drain is coupled to the second drain; and
a fourth transistor having a fourth gate, a fourth source, and a fourth drain, wherein the fourth gate is coupled to the second drain, the fourth source is coupled to the second source, and the fourth drain is coupled to the input terminal.

2. The apparatus of claim 1, further comprising:
a fifth transistor having a fifth gate, a fifth source, and a fifth drain, wherein the fifth gate is coupled to the enable signal terminal, and the fifth source is coupled to a voltage supply terminal; and
a diode having an anode coupled to the fifth drain, and a cathode coupled to the second source.

3. The apparatus of claim 1, wherein the second transistor is an enhancement mode p-type metal oxide semiconductor.

4. The apparatus of claim 3, wherein the fourth transistor is a depletion mode n-type metal oxide semiconductor.

5. The apparatus of claim 3, wherein the fourth transistor is a native n-type metal oxide semiconductor.

6. The apparatus of claim 1, wherein an absolute value of a threshold voltage of the fourth transistor is less than an absolute value of a threshold voltage of the second transistor.

7. The apparatus of claim 1, wherein the first transistor is a p-type metal oxide semiconductor and the third transistor is an n-type metal oxide semiconductor.

8. A system, comprising:
a signal circuit configured to provide a first analog signal having a first voltage;
a processing circuit; and
a switching circuit coupled to the signal circuit and the processing circuit, wherein the switching circuit is configured to provide a second analog signal to the processing circuit based on the first analog signal, and the first voltage is greater in value than a supply voltage of the switching circuit, wherein the switching circuit includes:
a first transistor having a first gate, a first source, and a first drain, wherein the first source is coupled to the signal circuit, and the first drain is coupled to the processing circuit;
a second transistor having a second gate, a second source, and a second drain, wherein the second gate is coupled to a ground terminal, and the second source is coupled to the first gate;
a third transistor having a third gate, a third source, and a third drain, wherein the third gate is coupled to an enable signal terminal, the third source is coupled to the ground terminal, and the third drain is coupled to the second drain; and
a fourth transistor having a fourth gate, a fourth source, and a fourth drain, wherein the fourth gate is coupled to the second drain, the fourth source is coupled to the second source, and the fourth drain is coupled to the signal circuit.

9. The system of claim 8, wherein the switching circuit includes:
a fifth transistor having a fifth gate, a fifth source, and a fifth drain, wherein the fifth gate is coupled to the enable signal terminal, and the fifth source is coupled to a voltage supply terminal; and
a diode having an anode coupled to the fifth drain, and a cathode coupled to the second source.

10. The system of claim 9, wherein responsive to a falling edge in an enable signal provided at the enable signal terminal, the fifth transistor and the diode precharge the gate of the fourth transistor, wherein precharging the gate of the fourth transistor reduces a current draw from the signal circuit through the fourth transistor.

11. The system of claim 8, wherein the second transistor is an enhancement mode p-type metal oxide semiconductor.

12. The system of claim 11, wherein the fourth transistor is a depletion mode n-type metal oxide semiconductor.

13. The system of claim 11, wherein the fourth transistor is a native n-type metal oxide semiconductor.

14. The system of claim 8, wherein an absolute value of a threshold voltage of the fourth transistor is less than an absolute value of a threshold voltage of the second transistor.

15. The system of claim 8, wherein the first transistor is a p-type metal oxide semiconductor and the third transistor is an n-type metal oxide semiconductor.

* * * * *